United States Patent
Pelley et al.

(10) Patent No.: US 10,032,515 B2
(45) Date of Patent: Jul. 24, 2018

(54) MEMORY REPAIR SYSTEM AND METHOD THEREFOR

(71) Applicant: FREESCALE SEMICONDUCTOR, INC., Austin, TX (US)

(72) Inventors: Perry H. Pelley, Austin, TX (US); Anirban Roy, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/054,186

(22) Filed: Feb. 26, 2016

(65) Prior Publication Data

US 2017/0249993 A1 Aug. 31, 2017

(51) Int. Cl.
G11C 15/04 (2006.01)
G11C 29/44 (2006.01)
G11C 29/00 (2006.01)
G11C 29/12 (2006.01)

(52) U.S. Cl.
CPC .............. *G11C 15/04* (2013.01); *G11C 29/44* (2013.01); *G11C 29/72* (2013.01); *G11C 29/78* (2013.01); *G11C 29/804* (2013.01); *G11C 29/808* (2013.01); *G11C 29/81* (2013.01); *G11C 29/12* (2013.01)

(58) Field of Classification Search
CPC ........ G11C 15/046; G11C 29/76; G11C 15/00
See application file for complete search history.

(56) References Cited

U.S. PATENT DOCUMENTS

| | | | |
|---|---|---|---|
| 5,349,558 A | | 9/1994 | Cleveland et al. |
| 5,958,065 A | * | 9/1999 | Klein .................... G11C 29/76 365/200 |
| 6,421,286 B1 | * | 7/2002 | Ohtani .................... G11C 29/44 365/189.07 |
| 2005/0081093 A1 | * | 4/2005 | Joly ........................ G11C 15/00 714/6.13 |
| 2005/0213359 A1 | * | 9/2005 | Kim ........................ G11C 15/00 365/49.1 |

OTHER PUBLICATIONS

Kristofik, S., "Repair Analysis for Embedded Memories Using Block-Based Redundancy Architecture", Proceedings of the World Congress on Engineering 2012, vol. II, WCE 2012, Jul. 4-6, 2012, London, U.K.
Eliason, J., "An 8Mb 1T1C Ferroelectric Memory With Zero Cancellation and Micro-Granularity Redundancy", IEEE Custom Integrated Circuits Conference, 2005.
Rao, T., "Global Block-Based Redundancy Architectures for Self-Repairing of Embedded Memories", International Journal of Modern Engineering Research (IJMER), vol. 2, Issue 4, Jul.-Aug. 2012, pp. 2458-2463.
Pagiamtzis, K., "Content-Addressable Memory (CAM) Circuits and Architectures: A Tutorial and Survey", IEEE Journal of Solid-State Circuits, vol. 41, No. 3, Mar. 2006.

* cited by examiner

*Primary Examiner* — Huan Hoang
*Assistant Examiner* — Minh Dinh

(57) ABSTRACT

A memory system includes a main memory array, a redundant memory array, and a content addressable memory (CAM). The CAM includes a plurality of entries, wherein each entry includes a plurality of column address bits and a plurality of maskable row address bits. When an access address for a memory operation matches an entry of the CAM, the memory system is configured to access the redundant memory array to perform the memory operation.

19 Claims, 5 Drawing Sheets

US 10,032,515 B2

MEMORY REPAIR SYSTEM AND METHOD THEREFOR

BACKGROUND

Field

This disclosure relates generally to memories, and more specifically, to a system and method for repairing memories.

Related Art

Memories usually consume a significant portion of die area in a semiconductor device. As semiconductor process technology advances, integrated circuit feature sizes (e.g. transistor gate length) continue to decrease. With smaller feature sizes, higher density memories can be implemented in a semiconductor device. One challenge with implementing higher density memories is that defectivity may remain significant. Accordingly, more redundant resources may be required to repair defects.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a content addressable memory (CAM) programmable to activate either a row or a column redundant element. A selected redundant element can be partitioned into different coverage patterns to repair defective memory elements on multiple rows or columns in a main memory. Activation bits control switches to select and determine if a match line is to be pre-charged. The term repair as used herein, generally refers to replacement of a defective memory element by a redundant memory element.

Figure 1:
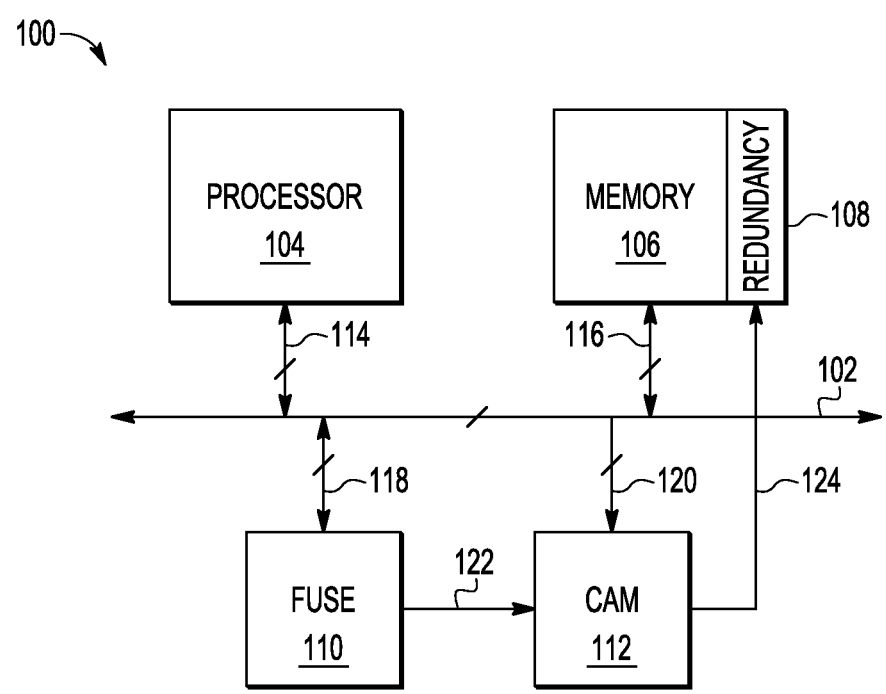
FIG. 1 illustrates, in simplified block diagram form, an integrated circuit in accordance with an embodiment of the present disclosure.

FIG. 1 illustrates, in simplified block diagram form, integrated circuit 100 in accordance with an embodiment of the present disclosure. In some embodiments, integrated circuit 100 is a system-on-a-chip (SoC). Integrated circuit 100 includes a system bus 102, processor 104, main memory 106, redundancy memory 108, fuse unit 110, and content addressable memory (CAM) 112. Processor 104, main memory array 106, fuse unit 110, and CAM 112 are coupled to the system bus 102 by way of respective buses 114-120. System bus 102 can be any type of bus for communicating any type of information such as data, address, and instructions.

Processor 104 may be any type of processor such as a microprocessor (MPU), microcontroller (MCU), digital signal processor (DSP), or other type of processing core. Integrated circuit 100 may include multiple processors like processor 104. Main memory 106 may include any type of volatile or non-volatile memory array, such as static random access memory (SRAM), dynamic random access memory (DRAM), flash, etc. Main memory 106 may also be coupled directly to processor 104. Redundancy memory 108 may include any type of volatile or non-volatile memory array and is generally a similar type memory as main memory 106. Redundancy memory 108 may be directly coupled to main memory 106 or may be separate from main memory 106. Fuse unit 110 has outputs for providing match address signals 122 to CAM 112. In some embodiments, fuse unit 110 may include non-volatile memory (NVM) such as a flash memory, electrically erasable programmable read-only memory (EEPROM), and the like. CAM 112 has outputs for providing selection control signals 124 to the redundancy array 108. One type of CAM architecture may be referred to as a binary CAM. The binary CAM requires just one storage bit per memory cell. Another CAM architecture may be referred to as a ternary CAM (TCAM) and may be used when certain fields of the addresses are masked. The TCAM requires two storage bits per memory cell. CAM 112 may include a mixed architecture where a first portion of bits are binary CAM bits and a second portion of bits are TCAM bits. In some embodiments, the first portion of bits may correspond to column address bits and the second portion of bits may correspond to maskable row address bits.

Integrated circuit 100 may include any number of other circuits and blocks such as processor, timer, counter, communication, interface, analog-to-digital converter, digital-to-analog converter, PLL, I/O, and the like for example.

Figure 2:
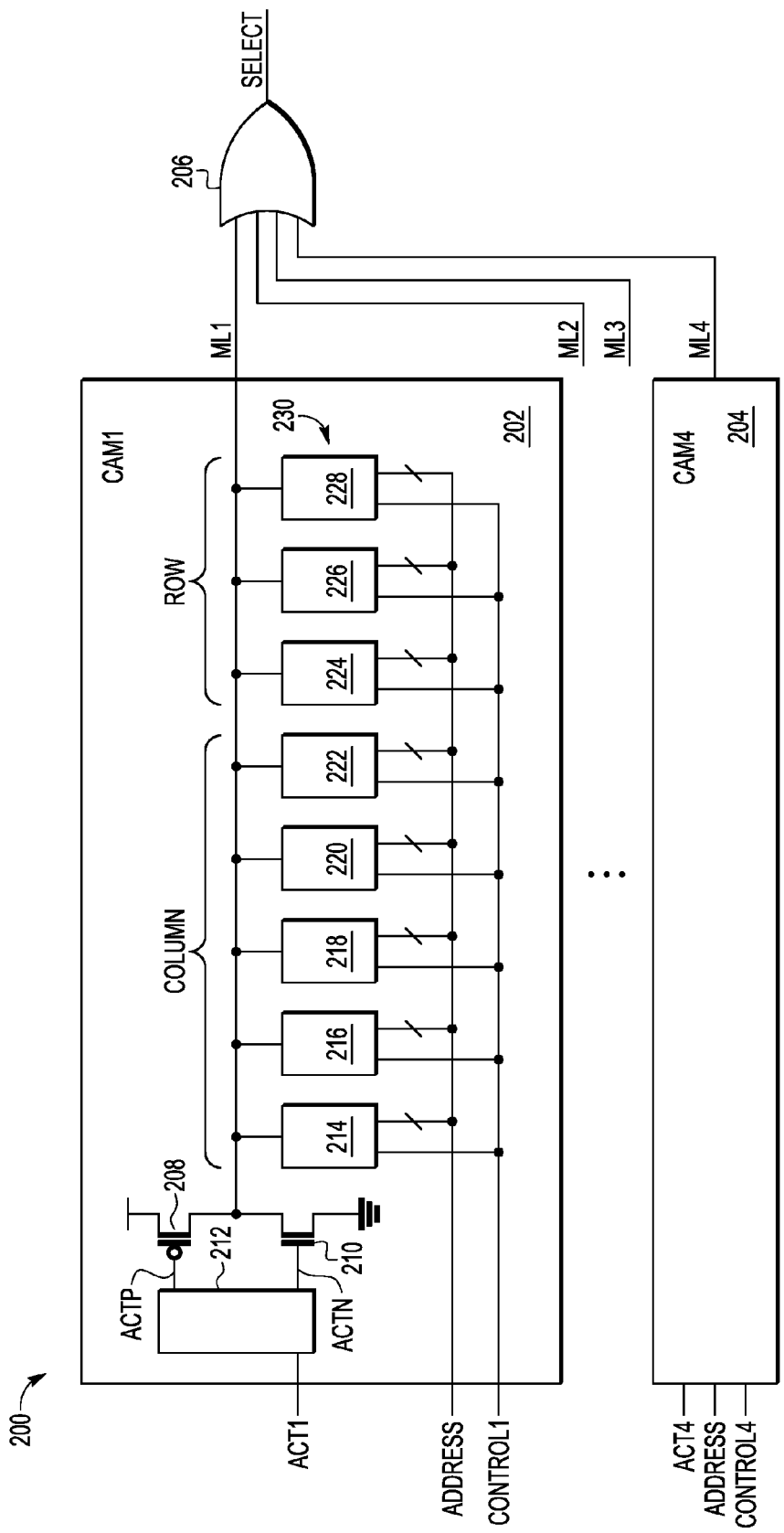
FIG. 2 illustrates, in simplified schematic diagram form, a plurality of content addressable memory (CAM) entries in accordance with an embodiment of the present disclosure.

FIG. 2 illustrates, in simplified schematic diagram form, a plurality of content addressable memory (CAM) entries 200 in accordance with an embodiment of the present disclosure. The plurality of CAM entries 200 may be arranged in any logical manner such as in groups or sets, for example. In this embodiment, the plurality or set of CAM entries 200 includes a four CAM entries (CAM1-4). The first CAM entry (CAM1) of the set 200 is shown in further detail as exemplary CAM entry circuitry 202 and is representative of circuitry in CAM entries CAM2-4. The second and third CAM entries (CAM2-3) are not shown, and the fourth CAM entry of the set is shown with input/output signals at block 204. Each CAM entry of the set has inputs to receive an activation signal (ACT1-4), addresses (ADDRESS), and a control signal (CONTROL1-4), and each CAM entry has an output for providing a match line signal (ML1-4). Match line signals labeled ML1-4 are received at the inputs of OR gate 206 to form a select signal labeled SELECT at the output of OR gate 206. In some embodiments, the SELECT signal may be gated or clocked such that a false selection could be avoided during pre-charge, for example.

CAM entry circuitry 202 includes a pre-charge circuit and a plurality of CAM bits 230 to form a match line (ML1). In this embodiment, the CAM entry pre-charge circuit includes pre-charge control 212 having an input to receive the activation signal, and an output coupled to pre-charge transistors 208 and 210. P-channel transistor 208 and an N-channel transistor 210 are selectively coupled to the match line. The activation signal ACT1 is received at the input of pre-charge control 212 and provides output signals ACTP and ACTN for controlling P-channel transistor 208 and an N-channel transistor 210 respectively. The P-channel transistor 208 has a first current electrode coupled to a first voltage supply, a second current electrode coupled to the match line (ML1), and a control electrode coupled to ACTP signal. The N-channel transistor 210 has a first current electrode coupled to a second voltage supply, a second current electrode coupled to the match line (ML1), and a control electrode coupled to the ACTN signal. In this embodiment, the first voltage supply may be referred to as VDD and the second voltage supply may be referred to as ground or VSS.

In operation, when the activation signal is asserted as a logic high level, for example, the resulting ACTP signal will turn on the P-channel transistor 208 to pre-charge the match line to voltage corresponding to a logic high and the resulting ACTN signal will turn off the N-channel transistor 210. The ACTP signal may be a pulsed signal to turn on the P-channel transistor 208. In some embodiments, a keeper device may be used to hold the pre-charged voltage on the match line. When the activation signal is de-asserted as a logic low level, the resulting ACTN signal will turn on the N-channel transistor 210 to discharge the match line. The P-channel transistor 208 is turned off when the activation signal is de-asserted.

Still referring to the embodiment shown in FIG. 2, a first portion of the plurality of CAM bits 230 includes one or more non-maskable column address bits (214-222) and a second portion of the plurality of CAM bits 230 includes one or more maskable row address bits (224-228). Maskable row address bit (224-222) may include circuitry to mask out a corresponding row address bit. In some embodiments, the first portion of the plurality of CAM bits 230 may include binary CAM bits, and the second portion of the plurality of CAM bits 230 may include TCAM bits. Each bit in the plurality of CAM bits 230 includes inputs coupled to receive the address signals (ADDRESS) and one or more control signals (CONTROL1), and an output coupled to provide a match indication to the match line (ML1). Row and column address information bits on ADDRESS signals from fuse block 110 are stored in the plurality of CAM bits 230 when control signal CONTROL1 is asserted as a logic high. In some embodiments, the address information bits may be stored as inverse or complementary address bits. When the CONTROL1 signal is de-asserted as a logic low, row and column address information bits may remain stored in the plurality of CAM bits 230 until power is removed or until the CONTROL1 signal is asserted again. In a similar manner, addresses are stored into CAM2-CAM4 by sequentially activating CONTROL2-4 signals.

In operation, an access address for a memory operation is compared with address information stored in activated entries of the CAM 112. When the access address matches an entry of the CAM 112, the redundant memory array 108 is accessed to perform the memory operation. When the access address does not match an entry of the CAM 112, the memory 106 is accessed to perform the memory operation.

Figure 3:
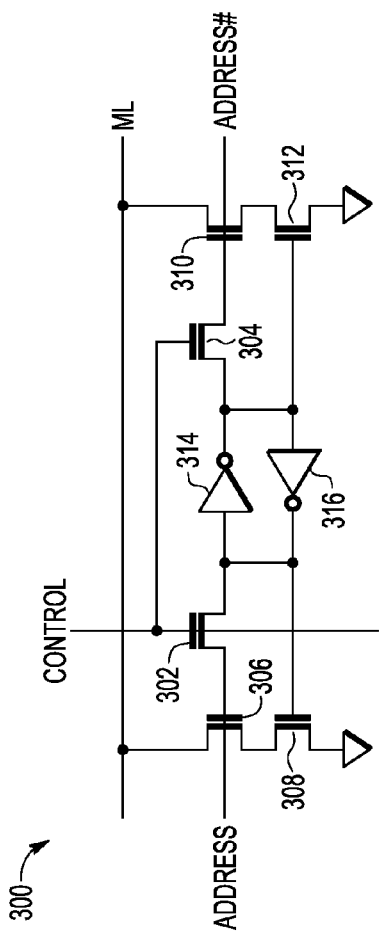
FIG. 3 illustrates, in schematic diagram form, an exemplary CAM bit cell in accordance with an embodiment of the present disclosure.

FIG. 3 illustrates, in schematic diagram form, an exemplary CAM bit cell 300 in accordance with an embodiment of the present disclosure. The architecture of CAM bit cell 300 may be referred to as a binary CAM bit cell. The binary CAM bit cell requires storage for one bit of information. CAM bit cell 300 includes inputs to receive ADDRESS, ADDRESS#, and CONTROL signals, and an output to provide a match indication on match line ML. A latch portion of the CAM bit cell 300 is formed with cross-coupled inverters 314 and 316. An input of inverter 314 is coupled to an output of inverter 316 and an output of inverter 314 is coupled to an input of inverter 316. Access transistors 302 and 304 are coupled between the latch portion and a first pair and a second pair of match transistors 306-312. The first pair of the match transistors includes N-channel transistors 306 and 308 coupled in series between a ground supply terminal and the match line ML. A first current electrode of transistor 306 is coupled to the match line ML and a second current electrode is couple to a first current electrode of transistor 308. The control electrode of transistor 306 and a first current electrode of access transistor 302 are coupled to receive an address labeled ADDRESS. A control terminal of access transistor 302 is coupled to a control signal labeled CONTROL, and a second current electrode of access transistor 302 is coupled to a control terminal of transistor 308, to the input of inverter 314, and to the output of inverter 316. The second current electrode of transistor 308 is coupled to ground. The second pair of the match transistors includes N-channel transistors 310 and 312 coupled in series between the ground supply terminal and the match line ML. A first current electrode of transistor 310 is coupled to the match line ML and a second current electrode is coupled to a first current electrode of transistor 312. The control electrode of transistor 310 and a first current electrode of access transistor 304 are coupled to receive a complementary address labeled ADDRESS#. A control terminal of access transistor 304 is coupled to the control signal labeled CONTROL, and a second current electrode of access transistor 304 is coupled to a control terminal of transistor 312, to the output of inverter 314, and to the input of inverter 316. The second current electrode of transistor 312 is coupled to ground.

CAM bit cell 300 is configured to store a first state such as a logic low or a second state such as a logic high. In a first phase of operation, an address information bit corresponding to the ADDRESS and ADDRESS# signals is stored into CAM bit cell 300 when the CONTROL signal is asserted as a logic high. In some embodiments, the address information bit may be stored as an inverse or complementary address bit. When the CONTROL signal is de-asserted as a logic low, the stored address information bit may remain stored until power is removed or until the CONTROL signal is asserted again. In a second phase of operation, with the CONTROL signal de-asserted, the match line is pre-charged to a logic high and ADDRESS and ADDRESS# signals are compared with the stored address information bit. When a match occurs, the match line ML remains at a logic high providing a match indication on the match line ML. The match line ML is deselected as a logic low when no match occurs.

Figure 4:
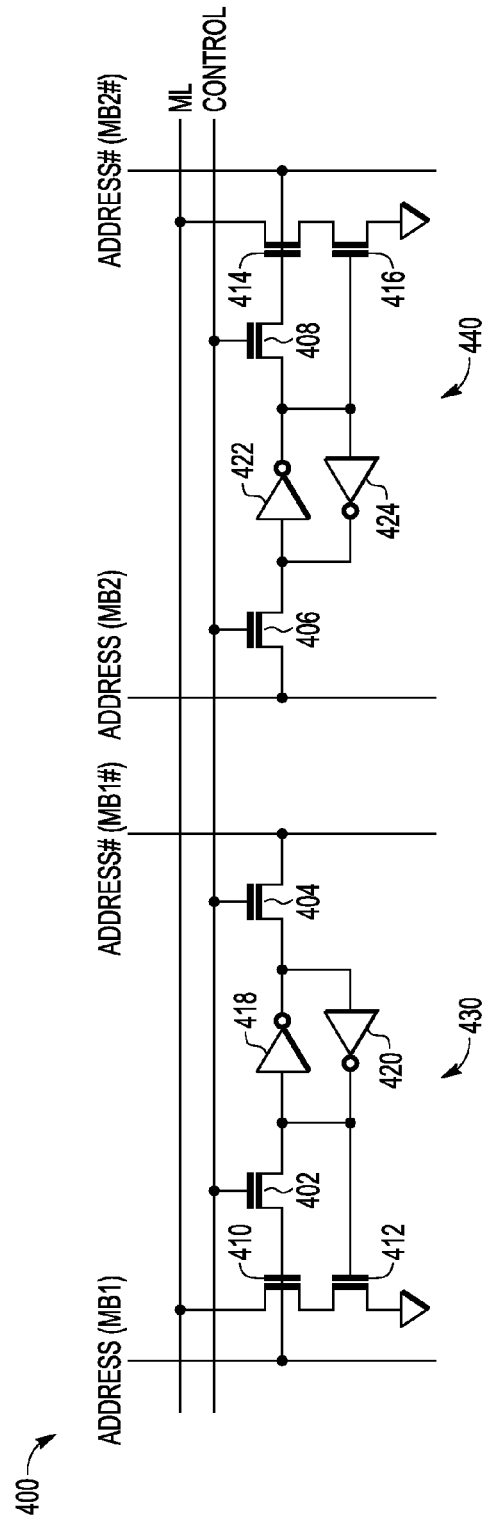
FIG. 4 illustrates, in schematic diagram form, an exemplary ternary content addressable memory (TCAM) bit cell in accordance with an embodiment of the present disclosure.

FIG. 4 illustrates, in schematic diagram form, an exemplary ternary content addressable memory (TCAM) bit cell in accordance with an embodiment of the present disclosure. TCAM bit cell 400 includes inputs to receive ADDRESS, ADDRESS#, and CONTROL signals, and an output to provide a match indication on match line ML. In this embodiment, TCAM bit cell 400 requires storage for 2 bits of information. TCAM bit cell 400 includes a first latch portion 430 and a second latch portion 440. The first latch portion 430 is formed with cross-coupled inverters 418 and 420. An input of inverter 418 is coupled to an output of inverter 420 and an output of inverter 418 is coupled to an input of inverter 420. A first access transistor 402 is coupled between the first latch portion and a first pair of match transistors. The first pair of match transistors includes N-channel transistors 410 and 412 coupled in series between a ground supply terminal and the match line ML. A first current electrode of transistor 410 is coupled to the match line ML and a second current electrode is coupled to a first current electrode of transistor 412. The control electrode of transistor 410 and a first current electrode of access transistor 402 are coupled to receive an address signal labeled ADDRESS (MB1). A control terminal of access transistor 402 is coupled to a control signal labeled CONTROL, and a second current electrode of access transistor 402 is coupled to a control terminal of transistor 412 and to the input of inverter 418 and the output of inverter 420. The second current electrode of transistor 412 is coupled to ground. A second access transistor 404 is coupled between the first latch portion and a complementary address signal labeled ADDRESS# (MB1#). A first current electrode of transistor 404 is coupled to the output of inverter 418 and the input of inverter 420. The second current electrode of transistor 404 is coupled to the complementary address signal labeled ADDRESS# and the control electrode is coupled to the control signal labeled CONTROL.

The second latch portion 440 is formed with cross-coupled inverters 422 and 424. An input of inverter 422 is coupled to an output of inverter 424 and an output of inverter 424 is coupled to an input of inverter 422. A first access transistor 406 is coupled between the second latch portion and the address signal labeled ADDRESS. A first current electrode of transistor 406 is coupled to the input of inverter 422 and the output of inverter 424. The second current electrode of transistor 406 is coupled to the address signal labeled ADDRESS (MB2) and the control electrode is coupled to the control signal labeled CONTROL. A second access transistor 408 is coupled between the second latch portion and a second pair of match transistors. The second pair of match transistors includes N-channel transistors 414 and 416 coupled in series between a ground supply terminal and the match line ML. A first current electrode of transistor 414 is coupled to the match line ML and a second current electrode is couple to a first current electrode of transistor 416. The control electrode of transistor 414 and a first current electrode of access transistor 408 are coupled to receive the complementary address signal labeled ADDRESS# (MB2#). A control terminal of access transistor 408 is coupled to a control signal labeled CONTROL, and a second current electrode of access transistor 408 is couple to a control terminal of transistor 416 and to the output of inverter 422 and the input of inverter 424. The second current electrode of transistor 416 is coupled to ground.

TCAM bit cell 400 is configured to store one of a first logic state such as a logic low, a second logic state such as a logic high, and a don't care state. In a first phase of operation, address information including a first match bit and a second match bit corresponding to the MB1 and MB2 signals on the respective ADDRESS and ADDRESS# signal lines is stored into TCAM bit cell 400 when the CONTROL signal is asserted as a logic high. In some embodiments, the address information bits may be stored as inverse or complementary address information bits. When the CONTROL signal is de-asserted as a logic low, the stored address information bits may remain stored until power is removed or until the CONTROL signal is asserted again. In a second phase of operation, with the CONTROL signal de-asserted, the match line is pre-charged (when activated) to a logic high and ADDRESS and ADDRESS# signals are compared with the stored address information bits. When a match occurs, the match line ML remains at logic high providing a match indication on the match line ML. The match line ML is discharged when no match occurs. Referring to FIG. 2, in some embodiments at least one maskable row address bit in each CAM entry CAM1-4 is programmed to a don't care state.

Figure 5:
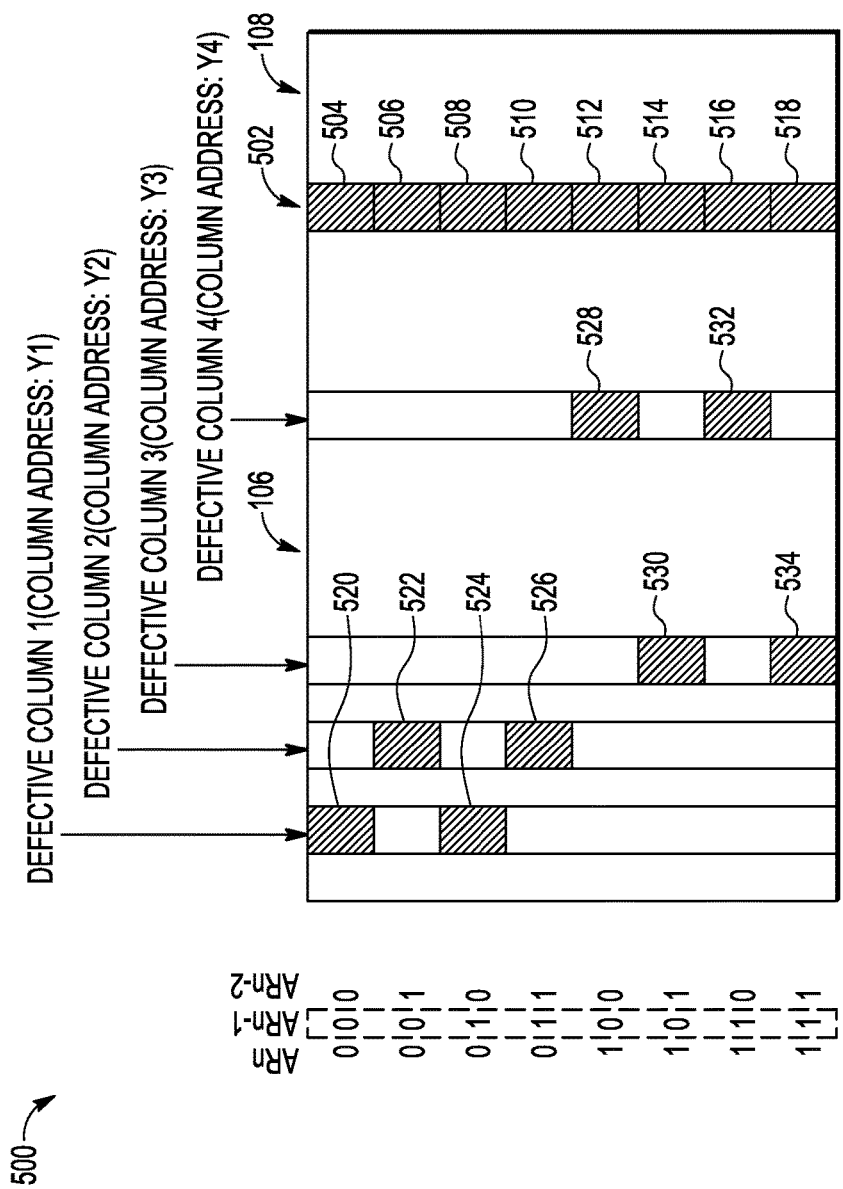
FIG. 5 illustrates, in simplified block diagram form, exemplary allocation of redundant column resources in accordance with an embodiment of the present disclosure.

FIG. 5 illustrates, in simplified block diagram form, an exemplary redundant column resource allocation 500 in accordance with an embodiment of the present disclosure. Redundant column 502 is shown as a shaded region in the redundancy array 108. In this embodiment, redundant column 502 is segmented into eight segments 504-518, each segment includes one or more bits. Other embodiments may include redundant columns having any number of segments. Resources of redundant column 502 can be used to repair defective or failing memory bits across multiple rows and multiple columns. In this embodiment, mapped redundant segments 520-534, shown as shaded regions in the main memory 106, correspond to segments 504-518 of redundant column 502 distributed across columns Y1-Y4. For example, an access address for a memory operation to a mapped segment 520-534 in main memory 106 results in an access to a corresponding segment 504-518 in redundant column 502. In another example, if column address Y1 of main memory 106 is accessed, redundant column segments 504 and 508 are mapped to segments 520 and 524 respectively such that defective portions of column address Y1 are effectively replaced while the remaining portions of column address Y1 are accessed normally. Further, when column address Y1 is accessed, segments 506, 510-518 of redundant column 502 are unused, but may be used when column addresses Y2, Y3, or Y4 are accessed. Therefore, redundant column 502 may be used to repair defective portions of multiple columns in main memory 106. ARn-ARn-2 are used to determine the size and boundaries of each mapped segment 520-534 and create a repair coverage pattern. The repair coverage pattern may differ for CAM1-4 thereby extending and optimizing defect replacement in main memory 106

Figure 6:
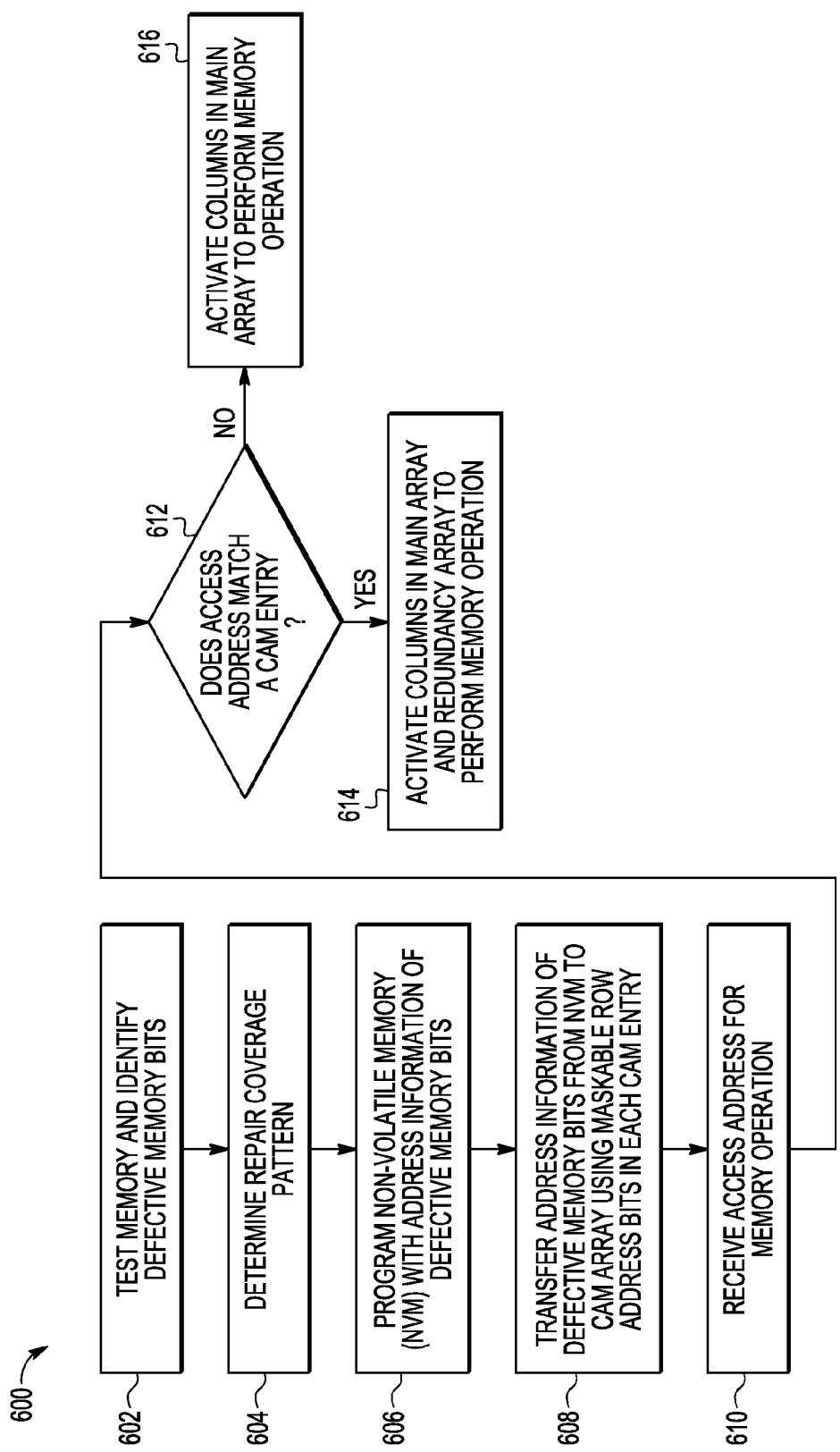
FIG. 6 illustrates, in simplified flow chart diagram form, a method for repairing defective memory bits in accordance with an embodiment of the present disclosure.

FIG. 6 illustrates, in simplified flow chart diagram form, a method 600 for repairing defective memory bits in accordance with an embodiment of the present disclosure.

At step 602, test memory and identify defective memory bits. The main memory 106 may be tested using any available test method including on-chip built-in self-test (BIST), factory test, scan test, and the like. Defective memory bits are identified including address information such as locations of bits, rows affected, columns affected, and the like.

At step 604, determine repair coverage pattern. A repair coverage pattern is determined which utilizes resources of redundant memory 108. For example, based on the address information of the identified defective memory bits, segments of one or more redundant columns in redundant memory 108 may be allocated to repair defective or failing bits.

At step 606, program non-volatile memory (NVM) with address information of defective memory bits. Address information corresponding to the determined repair coverage pattern is programmed into NVM. The NVM may include fuses, flash memory, electrically erasable programmable read-only memory (EEPROM), and the like.

At step 608, transfer address information of defective memory bits from NVM to CAM array using maskable row address bits in each CAM entry. In some embodiments, address information may be transferred to the CAM array during power-up. The address information programmed into NVM is stored in the CAM. For example, address information from the NVM is transferred using ADDRESS and ADDRESS# signals in FIG. 3 to store into CAM bit cell 300 when the CONTROL signal is asserted as a logic high. When the CONTROL signal is de-asserted as a logic low, the stored information may remain stored until power is removed or until the CONTROL signal is asserted again. The address information stored in each CAM entry includes column address bits and maskable row address bits which are used to boundaries and sizes of segments of redundant memory 108 resources.

At step 610, receive access address for memory operation. For example, addresses on bus 102 corresponding to a memory access for a memory operation are received at CAM 112 via bus 120. Received access address is then compared with address information stored in CAM entries.

At step 612, determine if access address matches a CAM entry. For example, the access address received at CAM 112 in FIG. 1 is compared with the stored address information in entries CAM1-4 in FIG. 2. Referring to FIG. 3, with the CONTROL signal de-asserted, the match line is pre-charged (for activated CAM1-4) to a logic high and ADDRESS and ADDRESS# signals corresponding to the access address are compared with a stored address information bit. If a match occurs for all bits 214-228 of one or more activated CAM1-4, the corresponding match line ML1-4 remains at logic high providing a match indication on the match line ML (YES). If a match does not occur, then all of the match lines ML1-4 are discharged as a logic low (NO).

At step 614, when the access address matches a CAM entry (YES), then activate columns in main memory array and redundant memory array to perform memory operation.

At step 616, when the access address does not match a CAM entry (NO), then activate columns in main memory to perform memory operation at step 616.

Generally, there is provided, a memory system including a main memory array; a redundant memory array; and a content addressable memory (CAM) including a plurality of entries, wherein each entry includes a plurality of column address bits and a plurality of maskable row address bits, wherein when an access address for a memory operation matches an entry of the CAM, the memory system is configured to access the redundant memory array to perform the memory operation. When the access address for the memory operation does not match any entry in the CAM, the memory system may be configured to access the main memory to perform the memory operation. Each of the plurality of maskable row address bit may include a ternary CAM cell. Each of the plurality of column address bits may include a binary CAM cell. Each ternary CAM cell may be configured to store one of a first logic state, a second logic state, and a don't care state, and each binary CAM cell may be configured to store only one of the first logic state or the second logic state. Each of the plurality of maskable row address bits may include switching circuitry to mask out the maskable row bit. Each of the plurality of column address bits may not be maskable.

In another embodiment, there is provided, a method of accessing a memory system having a main memory array, a redundant memory array, and a content addressable memory (CAM) includes determining if an access address for a memory operation matches an entry of the CAM wherein each entry of the CAM includes a plurality of column address bits and a plurality of maskable row address bits; when the access address results in a match in the CAM, accessing the redundant array to perform the memory operation; and when the access address does not match any entry in the CAM, accessing only the main memory array to perform the memory operation. The method may further include testing main memory array to identify defective bits; and programming CAM entries with address information corresponding to the address locations of the defective bits using the maskable row address bits. The method may further include after the testing the main memory array, programming a non-volatile memory (NVM) with the address information of the defective bits. Programming the CAM entries may include transferring the address information from the NVM to the CAM entries. The method may further include after the testing main memory, determining a repair coverage pattern for the defective bits, wherein the programming the CAM entries is performed such that the maskable row address bits are programmed to create the repair coverage pattern. At least one maskable row address bit in each CAM entry may be masked to create the repair coverage pattern. At least one maskable row address bit in each CAM entry may be programmed to a don't care state. Each of the plurality of maskable row address bit may include a ternary CAM cell. Each of the plurality of column address bits may include a binary CAM cell. Each ternary CAM cell may be configured to store one of a first logic state, a second logic state, and a don't care state, and each binary CAM cell may be configured to store only one of the first logic state or the second logic state.

In yet another embodiment, there is provided, a memory system including a main memory array; a redundant memory array; and a content addressable memory (CAM) including a plurality of entries, wherein each entry includes a plurality of binary CAM cells configured to store column address bits and a plurality of ternary CAM cells configured to store row address bits, wherein when an access address for a memory operation matches an entry of the CAM, the memory system is configured to access the redundant memory array to perform the memory operation. When the access address for the memory operation does not match any entry in the CAM, the memory system may be configured to access the main memory to perform the memory operation. Each ternary CAM cell may be configured to store one of a first logic state, a second logic state, and a don't care state, and each binary CAM cell may be configured to store only one of the first logic state or the second logic state.

By now it should be appreciated that there has been provided, a content addressable memory (CAM) programmable to activate either a row or a column redundant element. A selected redundant element can be partitioned into different coverage patterns to repair defective memory elements on multiple rows or columns in a main memory. Activation bits control switches to select and determine if a match line is to be pre-charged.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system, comprising:
   a non-volatile memory (NVM);
   a main memory array;
   a processor configured to test the main memory during a built-in-self-test to determine defective bit locations in the main memory, to store a first address associated with a first defective bit location from a first column of the main memory array in the NVM, and to store a second address associated with a second defective bit location from the main memory array in the NVM;
   a redundant memory array; and
   a content addressable memory (CAM) including a plurality of entries, wherein each entry includes a plurality of column address bits and a plurality of maskable row address bits, wherein, in a first phase, the CAM receives the first address from the NVM, stores the first address in a first entry of the CAM, receives the second address from the NVM, and stores the second address in a second entry of the CAM, and, in a second phase, when a first access address for a first memory operation matches the first address in the first entry of the CAM, the memory system is configured to access a first redundant bit location associated with the first defective bit location in a redundant column of the memory array to perform the first memory operation, and when a second access address for a second memory operation matches the second address in the second entry of the CAM, the memory system is configured to access a second redundant bit location associated with the second defective bit location in the redundant column of the memory array to perform the second memory operation.

2. The memory system of claim 1, wherein when the first access address for the first memory operation does not match the first address in the first entry in the CAM, the memory system is configured to access the main memory to perform the memory operation.

3. The memory system of claim 1, wherein each of the plurality of maskable row address bits comprises a ternary CAM cell.

4. The memory system of claim 3, wherein each of the plurality of column address bits comprises a binary CAM cell.

5. The memory system of claim 4, wherein each ternary CAM cell is configured to store one of a first logic state, a second logic state, and a don't care state, and wherein each binary CAM cell is configured to store only one of the first logic state or the second logic state.

6. The memory system of claim 1, wherein each of the plurality of maskable row address bits comprises switching circuitry to mask out the maskable row bit.

7. The memory system of claim 1, wherein each of the plurality of column address bits are not maskable.

8. The memory system of claim 1, wherein:
the processor is further configured to store a third address associated with a third defective bit location from a third column of the main memory array in the NVM;
in the first phase, the CAM further receives the third address from the NVM, and stores the third address in a third entry of the CAM; and
in the second phase, when a third access address for a third memory operation matches the third address in the third entry of the CAM, the memory system is configured to access a third redundant bit location associated with the third defective bit location in the redundant column of the memory array to perform the third memory operation.

9. A method of accessing a memory system having a main memory array, a redundant memory array, and a content addressable memory (CAM), comprising:
testing the main memory array during a built-in-self-test to identify defective bits; and
determining if a first access address for a first memory operation matches a first entry of the CAM wherein each entry of the CAM comprises a plurality of column address bits and a plurality of maskable row address bits, each entry of the CAM further being associated with a defective bit location of the memory array;
when the first access address results in a match in the CAM, accessing a first redundant bit location associated with a first defective bit location in a redundant column of the array to perform the first memory operation;
when the first access address does not match any entry in the CAM, accessing only the main memory array to perform the first memory operation;
determining if a second access address for a second memory operation matches a second entry of the CAM;
when the second access address results in a match in the CAM, accessing a second redundant bit location associated with a second defective bit location in the redundant column to perform the second memory operation; and
when the second access address does not match any entry in the CAM, accessing only the main memory array to perform the second memory operation.

10. The method of claim 9, further comprising:
programming CAM entries with address information corresponding to the address locations of the defective bits using the maskable row address bits.

11. The method of claim 10, further comprising:
after the testing the main memory array, programming a non-volatile memory (NVM) with the address information of the defective bits.

12. The method of claim 11, wherein programming the CAM entries comprises transferring the address information from the NVM to the CAM entries.

13. The method of claim 10, further comprising:
after the testing main memory, determining a repair coverage pattern for the defective bits, wherein the programming the CAM entries is performed such that the maskable row address bits are programmed to create the repair coverage pattern.

14. The method of claim 13, wherein at least one maskable row address bit in each CAM entry is masked to create the repair coverage pattern.

15. The method of claim 14, wherein at least one maskable row address bit in each CAM entry is programmed to a don't care state.

16. The method of claim 9, wherein each of the plurality of maskable row address bits comprises a ternary CAM cell.

17. The method of claim 16, wherein each of the plurality of column address bits comprises a binary CAM cell.

18. The method of claim 17, wherein each ternary CAM cell is configured to store one of a first logic state, a second logic state, and a don't care state, and wherein each binary CAM cell is configured to store only one of the first logic state or the second logic state.

19. The method of claim 9, further comprising:
determining if a third access address for a third memory operation matches a third entry of the CAM;
when the third access address results in a match in the CAM, accessing a third redundant bit location associated with a third defective bit location in the redundant column to perform the third memory operation; and
when the third access address does not match any entry in the CAM, accessing only the main memory array to perform the third memory operation.

* * * * *